(12) United States Patent
Bobbitt, III

(10) Patent No.: US 12,328,848 B2
(45) Date of Patent: Jun. 10, 2025

(54) SYSTEMS AND METHODS FOR CONTROLLING HEAT TRANSFER BETWEEN COMPONENTS

(71) Applicant: BATTELLE SAVANNAH RIVER ALLIANCE, LLC, Aiken, SC (US)

(72) Inventor: John T. Bobbitt, III, Evans, GA (US)

(73) Assignee: Battelle Savannah River Alliance, LLC, Aiken, SC (US)

( * ) Notice: Subject to any disclaimer, the term of this patent is extended or adjusted under 35 U.S.C. 154(b) by 193 days.

(21) Appl. No.: 18/332,847

(22) Filed: Jun. 12, 2023

(65) Prior Publication Data
US 2024/0414886 A1  Dec. 12, 2024

(51) Int. Cl.
*H05K 7/20* (2006.01)
*H01L 23/373* (2006.01)

(52) U.S. Cl.
CPC ....... *H05K 7/20509* (2013.01); *H01L 23/373* (2013.01); *H05K 7/2049* (2013.01)

(58) Field of Classification Search
CPC .................. H01L 23/373; G06F 1/20
See application file for complete search history.

(56) References Cited

U.S. PATENT DOCUMENTS

| | | | |
|---|---|---|---|
| 6,404,636 B1 * | 6/2002 | Staggers | H05K 7/20445 165/185 |
| 9,025,333 B1 * | 5/2015 | Spowart | B64G 1/50 62/383 |
| 9,099,442 B2 | 8/2015 | Li et al. | |
| 10,267,578 B2 * | 4/2019 | Wood | F03G 7/065 |
| 10,658,280 B2 | 5/2020 | Lu | |
| 10,818,906 B2 | 10/2020 | Fan | |
| 11,112,190 B2 | 9/2021 | Villette et al. | |
| 12,001,228 B2 * | 6/2024 | Kishore | F24F 5/00 |
| 2010/0065263 A1 * | 3/2010 | Tanchon | F25D 19/006 165/277 |
| 2019/0348344 A1 | 11/2019 | Lu et al. | |
| 2020/0072564 A1 * | 3/2020 | Haseba | H05K 7/20963 |

FOREIGN PATENT DOCUMENTS

| | | | |
|---|---|---|---|
| CN | 101424862 A | * | 5/2009 |
| JP | 6492211 B1 | | 3/2019 |

OTHER PUBLICATIONS

Jeremy Thomas, "3D printed metamaterial shrinks when heated", Retrieved on Apr. 27, 2022 from https://www.llnl.gov/news/3d-printed-metamaterial-shrinks-when-heated, 3 pages.

* cited by examiner

*Primary Examiner* — Zachary Pape

(57) ABSTRACT

A system for controlling heat transfer between components. The system includes a first component and a second component spaced apart from the first component. The system also includes a thermal diode positioned between the first and second components. The thermal diode includes a negative coefficient of thermal expansion layer and a positive coefficient of thermal expansion layer. The thermal diode is configured to transition between a connected state and a disconnected state. The thermal diode is configured to transition back-and-forth between the connected and disconnected states with variations in at least one of a first temperature of the first component or a second temperature of the second component.

20 Claims, 4 Drawing Sheets

SYSTEMS AND METHODS FOR CONTROLLING HEAT TRANSFER BETWEEN COMPONENTS

FEDERAL RESEARCH STATEMENT

This invention was made with government support under Contract No. DE-AC09-08SR22470 awarded by the U.S. Department of Energy. The government has certain rights in the invention.

FIELD OF THE INVENTION

The present subject matter relates generally to controlling the transfer of heat between adjacent components and, more particularly, the use of an automatically adjustable or self-regulating thermal diode for controlling such heat transfer.

BACKGROUND OF THE INVENTION

Generally, diodes are devices that can permit the flow of energy (e.g., electricity or heat) in one direction. Particularly, a thermal diode is a device whose thermal resistance is different for heat flow in one direction than for heat flow in the other direction. For example, heat will flow easily from a first side of the diode to an opposed second side of the diode, but when the second side is hotter than the first side, the thermal resistance is higher thus little heat will flow from the second side to the first side. A disadvantage of thermal diodes is that the opposed second side can then become overheated because the heat cannot flow through from the second side to the first side and out of the thermal diode.

In this regard, there is a need for improved systems and methods for using thermal diodes to prevent overheating. A thermal diode able to control the flow of heat in more than one direction therein would be advantageous.

BRIEF DESCRIPTION OF THE INVENTION

Aspects and advantages of the invention will be set forth in part in the following description, or may be apparent from the description, or may be learned through practice of the invention.

In one example embodiment, a system for controlling heat transfer between components. The system includes a first component and a second component spaced apart from the first component. The system also includes a thermal diode positioned between the first and second components in order to selectively provide a thermal connection between the first and second components. The thermal diode includes a negative coefficient of thermal expansion layer that defines an inner side and outer side. The outer side is configured to be thermally connected to the first component. The thermal diode also includes a positive coefficient of thermal expansion layer that defines an inner side and an outer side. The outer side is configured to be thermally connected to the second component. The thermal diode is configured to transition between a connected state, at which the negative and positive coefficient of thermal expansion layers provide the connection between the first and second components allowing a flow of energy between the first and second components, and a disconnected state, at which the negative and positive coefficient of thermal expansion layers separate from each other creating a gap therebetween that prevents the flow of energy between the first and second components. The thermal diode is configured to transition back-and-forth between the connected and disconnected states with variations in at least one of a first temperature of the first component or a second temperature of the second component.

In another example embodiment, a method of controlling heat transfer between first and second components. A thermal diode is positioned between the first and second components in order to selectively provide a thermal connection therebetween. The thermal diode includes a negative coefficient of thermal expansion layer and a positive coefficient of thermal expansion layer. The negative coefficient of thermal expansion layer defines an inner side and outer side, with the outer side of the negative coefficient of thermal expansion layer being configured to be thermally connected to the first component. The positive coefficient of thermal expansion layer defines an inner side and an outer side, with the outer side of the positive coefficient of thermal expansion layer being configured to be thermally connected to the second component. The method includes transitioning the thermal diode from a connected state, at which the negative and positive coefficient of thermal expansion layers provide the connection between the first and second components to allow a flow of energy between the first and second components, to a disconnected state, at which the negative and positive coefficient of thermal expansion layers separate from each other to create a gap therebetween that prevents the flow of energy between the first and second components. The transition is based on a variation in at least one of a first temperature of the first component or a second temperature of the second component. The method also includes transitioning the thermal diode from the disconnected state back to the connected state based on a further variation in the at least one of the first temperature of the first component or the second temperature of the second component.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures.

Figure 1:
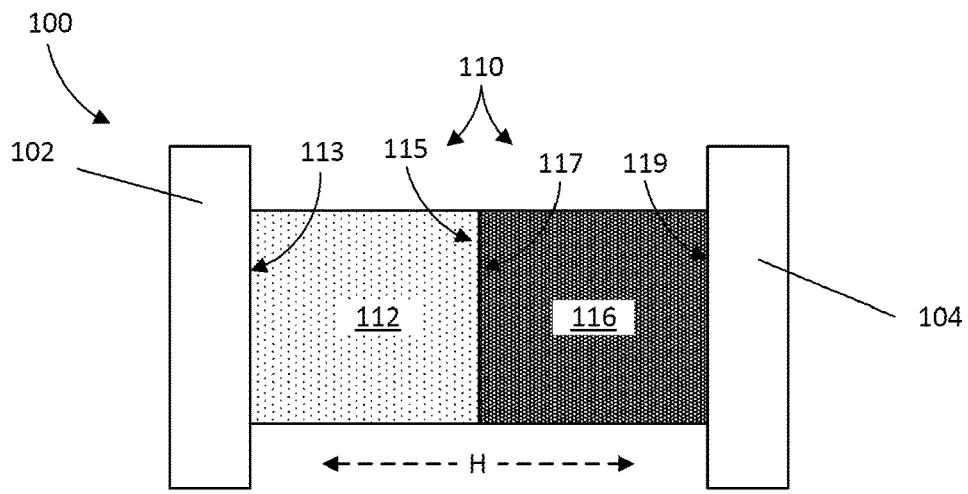
FIG. 1 illustrates a schematic side view of one embodiment of a system for controlling heat transfer between two components using a thermal diode in accordance with aspects of the present subject matter, particularly illustrating the thermal diode in a connected state.

Repeat use of reference characters in the present specification and drawings is intended to represent the same or analogous features or elements of the present invention.

DETAILED DESCRIPTION OF THE INVENTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

In general, the present subject matter is directed to systems and related methods for controlling energy transfer between components using a thermal diode. Specifically, the disclosed system is configured for use in association with electronic components or any other suitable components where energy transfer may occur. The system may include a thermal diode extending between two components (e.g., first and second components), with the thermal diode being configured to control energy transfer between such components. In one embodiment, at least one of the components may correspond to a heat-generating component. As will be described below, the thermal diode may include a positive coefficient of thermal expansion layer and a negative coefficient of thermal expansion layer, with the positive and negative coefficient of thermal expansion layers each being configured to expand or contract between the components. In one embodiment, the thermal diode may be configured to transition between a connected state and a disconnected state. The connected state may be characterized by the negative and positive coefficient of thermal expansion layers contacting or abutting one another to provide a connection between the first and second components, thus allowing a flow of energy (e.g., thermal energy or electrical energy) between the first and second components. The disconnected state may be characterized by the negative and positive coefficient of thermal expansion layers being separated from each other, thus creating a gap therebetween that prevents the flow of energy between the first and second components. By configuring the thermal diode as disclosed herein, the thermal diode may be generally configured to transition back-and-forth between the connected and disconnected states with variations in at least one of a first temperature of the first component or a second temperature of the second component. Such a configuration may be advantageous when at least one of the components thermally coupled to the thermal diode is an electronic component or other component that is heat-sensitive or otherwise requires heat dissipation therefrom.

In general, an example scenario may exist where an electronic component includes an optimal operating temperature range and a maximum operating temperature that is higher than optimum. When the external environment exceeds the optimal operating temperature range, the thermal diode is configured to separate to prevent the outside environment from heating up the electronics. However, if the electronic component generates heat itself such that the temperature of the component exceeds the optimal operating temperature range, the thermal diode is configured to reconnect to allow heat flow to the external environment. Moreover, the example scenario may extend to instances in which the thermal diode returns back to the disconnected state, such as when the external environment exceeds the operating temperature of the electronic component.

Figure 2:
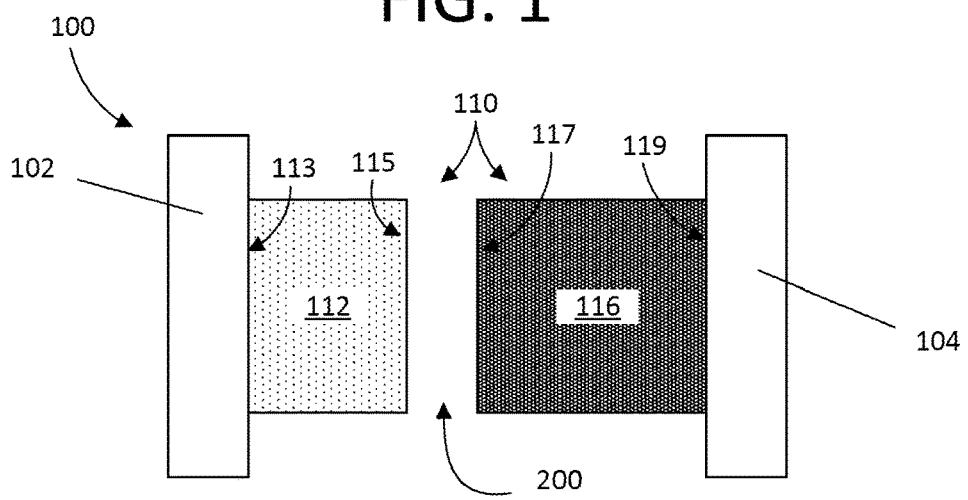
FIG. 2 illustrates another schematic side view of the embodiment of the system of FIG. 1, particularly illustrating the thermal diode in a disconnected state in which the adjacent components are thermally disconnected in accordance with aspects of the present subject matter.
Figure 3:
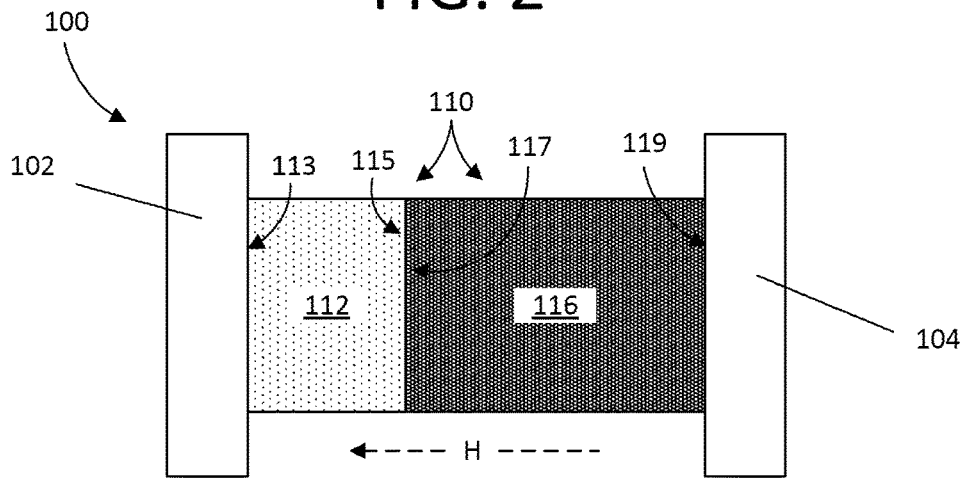
FIG. 3 illustrates another schematic side view of the embodiment of the system of FIG. 1, particularly illustrating the thermal diode again in a connected state in which heat transfer occurs between the adjacent components in accordance with aspects of the present subject matter.

Referring now to FIGS. 1-3, several schematic views of one embodiment of a system 100 for controlling heat transfer between components is illustrated in accordance with aspects of the present subject matter. As may be seen in FIG. 1, in general, system 100 may include a thermal diode 110 positioned between a first component 102 and a second component 104. In general, first component 102 may be a heat source (e.g., a heat-generating component) or simply a component capable of heat transfer, and similarly, second component 104 may be a heat source (e.g., a heat-generating component) or simply a component capable of heat transfer. Thermal diode 110 may be generally configured to control heat transfer between first component 102 and second component 104. In particular, when in a connected state as shown in FIG. 1 thermal diode 110 may be configured to extend fully between the first and second components 102, 104, thereby providing an energy transfer path therebetween. However, when in a disconnected state as shown in FIG. 2, the thermal diode creates a gap or disruption in the energy transfer path between the first and second components 102, 104, thereby disrupting the flow of energy therebetween. In this regard, a transition point at which the thermal diode transitions between the connected state and the disconnected state may depend upon a temperature of one or both of the first and second components 102, 104 and/or the material properties of the thermal diode 110. For example, the transition point may occur at different temperatures of the first and second components by tailoring or selecting the material properties of the thermal diode 110, e.g., thickness or coefficient of expansion/retraction.

As an example, when the first component 102 heats up and heat is transferred from such component to the portion of the thermal diode 110 coupled thereto (e.g., layer 112) to a certain degree (e.g., relative to the temperature of the second component and/or the portion of the thermal diode 110 coupled thereto (e.g., layer 116)), the diode 110 is configured to provide a thermal disconnect between the components 102, 104, thereby preventing heat from being transferred through thermal diode 110 from first component 102 to second component 104. While such thermal disconnection may prevent heat transfer from occurring from the first component 102 to the second component 104, instances may exist in which the temperature of the second component 104 continues to rise despite the thermal disconnect (e.g., when the second component 104 is a heat-generating component or is coupled to a heat-generating component), in which case it may be advantageous to thermally reconnect the first and second components to allow for heat transfer from the second component 104 to the first component 102. Thus, as may be seen in FIG. 3, thermal diode 110 may be configured to reestablish the energy transfer pathway (e.g., the thermal connection) between the components 102, 104 to allow for heat dissipation from the second component 104.

In general, a temperature differential between the temperature of the first component (hereinafter referred to as the "first temperature") and the temperature of the second component (hereinafter referred to as the "second temperature") may be used to design thermal diode 110 for expected or desired operating conditions. The temperature differential may be used to selectively control when the disconnected state occurs, with respect to the material properties of thermal diode 110. For example, in environments with colder temperatures and when there is no differential between the first and second temperatures, thermal diode 110 may stay in the disconnected state longer. However, in environments with colder temperatures and if there is a positive non-zero differential between the first and second temperatures, thermal diode 110 may reconnect more quickly.

Referring generally to FIGS. 1-3, to allow for such differing states of thermal connections between the components 102, 104, thermal diode 110 may, in several embodiments, include a negative coefficient of thermal expansion (NTC) layer 112, e.g., any suitable material which has a negative coefficient of thermal expansion, and a positive coefficient of thermal expansion (PTC) layer 116, e.g., any suitable material which has a positive coefficient of thermal expansion. Particularly, NTC/PTC layers 112,116 may include one or more material properties, such as a given thickness and a coefficient of expansion or retraction. Additionally, one or both of NTC/PTC layers 112,116 may have a spring rate and ductility. The spring rate and ductility may be part of the thermal diode 110 full length, or, in alternative example embodiments, may be achieved by a section of thermal diode 110 that is specifically designed to have the spring rate and ductility. Depending on the first and second temperatures, the combined length of 112 and 116 might be longer than the distance between 102 and 104, thus providing a compressive force to ensure good contact between the NTC/PTC layers 112,116. Tailoring the thickness or coefficient of expansion of the NTC/PTC layers 112,116 may control the transition point, e.g., the transition point may occur at different temperatures of the first and second components of the thermal diode 110. In other words, increasing or decreasing the thickness of at least one of the NTC/PTC layers may vary the expansion or retraction distance with respect to a constant coefficient of expansion. For example, assuming a constant coefficient of expansion of 0.1/° C., a 100 mm thick material would increase 10 mm for each degree Celsius increase, and a 1000 mm thick material would increase 100 mm for each degree Celsius increase. Further, using a material with higher or lower coefficients of expansion may further vary the expansion or retraction distance. For example, a 100 mm thick material would increase 10 mm for each degree Celsius increase with a coefficient of expansion of 0.1/° C., and a material of the same length (100 mm) would increase 5 mm for each degree Celsius increase with a coefficient of expansion of 0.05/° C. As such, the combination of tailoring the thickness or coefficient of expansion of the NTC/PTC layers 112,116 may adjust the transition point and when thermal diode 110 connects, disconnects, and reconnects.

In the current example embodiment, NTC layer 112 is thermally connected to first component 102 at an outer side 113 of the NTC layer 112, and PTC layer 116 is thermally connected to second component 104 at an outer side 119 of the PTC layer 116. As shown in FIGS. 1 and 3, when providing an energy transfer pathway, an inner side 115 of NTC layer 112 and an inner side 117 of PTC layer 116 may be thermally connected such that there is unimpaired energy connection across system 100 (e.g., to allow energy transfer between the first and second components 102, 104). However, as shown in FIG. 2, when disconnected, the inner side 115 of NTC layer 112 may be spaced apart from the inner side 117 of PTC layer 116 such that a gap 200 is defined between the layers 112, 114, thereby thermally disconnecting the energy transfer pathway across system 100.

As indicated above, an increase in the temperature in the first component 102 (or an increase in the amount of energy transfer from the first component 102 to the NTC layer 112, may cause the diode 110 to transition from the connected state shown in FIG. 1 to the disconnected state shown in FIG. 2. For example, when heat is transferred from the first component 102 to the NTC layer 112 such that a temperature of the NTC layer 112 increases, NTC layer 112 may contract (e.g., at a rate mm/° C.) relative to the PTC layer 116 in order to prevent heat from being transferred through thermal diode 110 from first component 102 to second component 104. It should be appreciated the rate of expansion/contraction (mm/° C.) may be the same or different for each of NTC layer 112 and PTC layer 116. As such, the rate of expansion/contraction may be utilized to design various embodiments of thermal diode 110 for use in varying temperature ranges.

As shown in FIG. 2, the contraction of NTC layer 112 may cause a separation or gap 200 between inner side 115 of NTC layer 112 and inner side 117 of PTC layer 116. In general, gap 200 may reduce or eliminate thermal conductivity across thermal diode 110. Specifically, the gap 200 may be filled with a vacuum to achieve lower energy transfer than the gap 200 filled with air. Additionally or alternatively, in some embodiments, gap 200 may be filled with a material with suitable low heat transfer properties such as conduction, convection, and radiation. For example, thermal gap 200 may be a vacuum or a suitable medium with low heat transfer thermal properties, e.g., the vacuum or medium may have lower thermal properties than those of NTC and PTC layers 112, 116, respectively. In some additional or alternative embodiments, the inner side 115 of NTC layer 112 and the inner side 117 of PTC layer 116 may be coated with a low emissivity coating to reduce radiation heat transfer between the inner layers 115, 117.

Additionally, as indicated above, an increase in the temperature in the second component 104 (or an increase in the amount of heat transfer from the second component 104 to the PTC layer 116) may cause the thermal diode 110 to transition from the disconnected state shown in FIG. 2 to the connected state shown in FIG. 3. For example, when heat is transferred from the second component 104 to the PTC layer 116, the PTC layer 116 may expand (e.g., at a rate mm/° C.) in order to allow heat to transfer through thermal diode 110 from second component 104 to first component 102. The expansion of PTC layer 116 may close the gap 200 and thermally reconnect the PTC/NTC layers 112, 116, thereby thermally reconnecting the first and second components 102, 104. Specifically, PTC layer 116 may expand such that inner side 117 of PTC layer 116 may reconnect with inner side 115 of NTC layer 112, thus closing gap 200 and allowing heat to be transferred from the second component 104 to the first component 102.

The above-described states of the thermal diode 110 may be advantageous when the second component 104 is a heat-sensitive component (e.g., an electronic component). In such instances, contraction of the NTC layer 112 (e.g., due to an increase in temperature of the layer) may prevent energy transfer from the first component 102 into the second component 104, thereby preventing overheating of the second component 104. However, if excessive heat still builds up in the second component 104, expansion of the PTC layer 116 (e.g., due to an increase in temperature of the layer), will allow for the gap 200 created in the thermal diode 110 to be bridged even in instance in which the NTC layer 112 is still contracted. As such, heat may flow from the second component 104 outwardly to the first component 102.

It should also be appreciated that other scenarios may occur in which the thermal connection provided by the diode 110 is disconnected or reconnected. For instance, while PTC layer 116 may be expanded, such as in FIG. 3, NTC layer 112 may further contract in response to increasing temperatures at first component 102 to re-form gap 200 and prevent heat transfer between the components 102, 104. Similarly, in such instance, PTC layer 116 may, for example, further expand in response to increasing temperature at second component 104 to re-close gap 200 and allow heat to transfer from second component 104 to first component 102. As such, NTC layer 112 and PTC layer 116 may be configured to work in series, e.g., the NTC layer 112 independently reacts to heat transfer from the first component 102 and the PTC layer 116 independently reacts to heat transfer from the second component 104.

Additional or alternative embodiments may exist that include thermal diode 110, e.g., NTC layer 112 and PTC layer 116, in an electrical switch. The thermal diode 110 may be used to connect or disconnect a circuit based on the first and second temperature differences, similar to the above. This example electrical switch may alter the transition point based on the differences between first and second temperatures.

Figure 4:
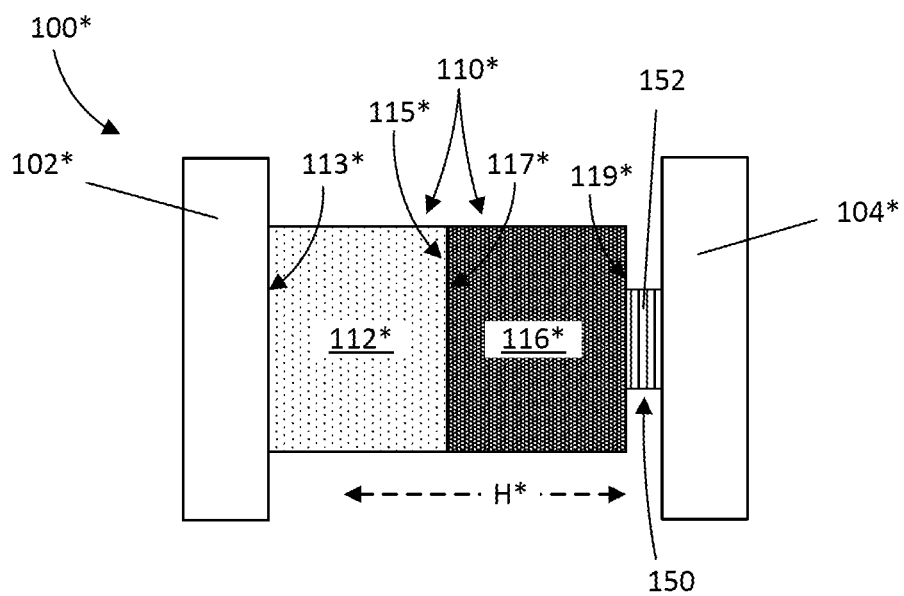
FIG. 4 illustrates a schematic side view of another embodiment of a system for controlling heat transfer between two components using a thermal diode in accordance with aspects of the present subject matter, particularly illustrating the thermal diode in a connected state.
Figure 5:
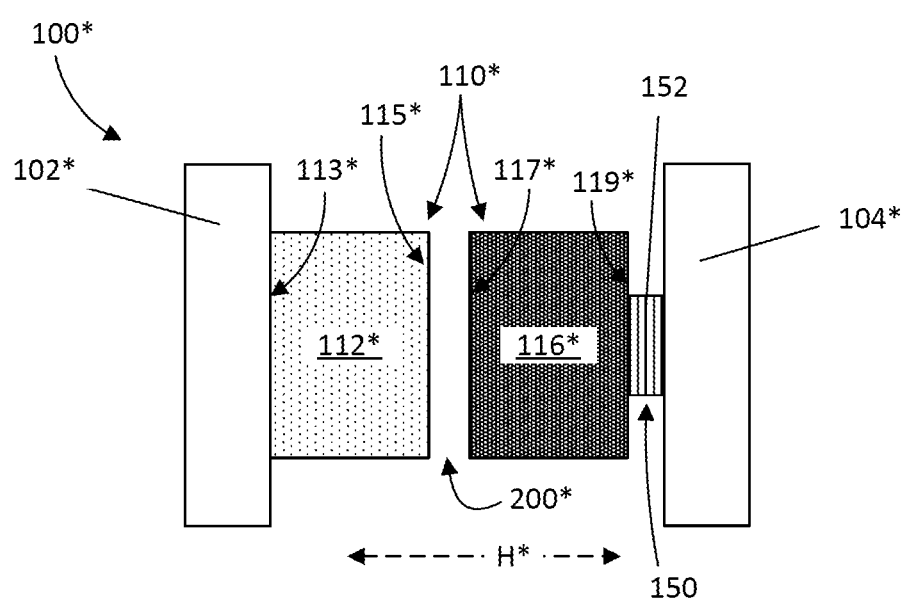
FIG. 5 illustrates another schematic side view of the embodiment of the system of FIG. 4, particularly illustrating the thermal diode in in a disconnected state in which the adjacent components are thermally disconnected in accordance with aspects of the present subject matter.

Referring now to FIGS. 4-5, schematic views of another embodiment of a system 100* for controlling heat transfer between components using an associated thermal diode 110* is illustrated in accordance with aspects of the present subject matter. In general, the system 100* and thermal diode 110* shown in FIGS. 4-5 (and their associated components, features, and/or structures) are configured similar to the system 100 and thermal diode 110 (and their associated components, features, and/or structures) described above with reference to FIGS. 1-3. As such, the components, features, and/or structures of the system 100* and thermal diode 110* that are the same or similar to corresponding components, features, and/or structures of the system 100 and thermal diode 110 described above will be designated by the same reference character with an asterisk (*) added. Additionally, when a given component, feature, and/or structure of the system 100* and/or thermal diode 110* is configured to generally perform the same function as the corresponding component, feature, and/or structure of the system 100 and/or thermal diode 110 described above, a less detailed description of such component/feature/structure will be provided below for the sake of brevity.

As shown in FIGS. 4 and 5, similar to the embodiment described above, thermal diode 110* is configured to extend between a first component 102* and a second component 104* to control energy transfer between the components. As shown in the illustrated embodiment, thermal diode 110* includes an NTC layer 112* and a PTC layer 116*. The NTC layer 112* has an outer side 113* thermally coupled to the first component 102* and an inner side 115* positioned closest to the PTC layer 116*. The PTC layer 116* has an inner side 117* positioned closest to the NTC layer 112*.

Unlike the embodiment described above in which PTC layer 116 is directly thermally coupled to the second component 104, the PTC layer 116*, as shown in the example embodiment of FIG. 4, has an outer side 119* that is coupled to a biasing mechanism 150. In the illustrated embodiment, the biasing mechanism 150 is positioned between the second component 104* and the PTC layer 116* and provides an energy pathway for energy to flow either to second component 104* from PTC layer 116* or from second component 104* to PTC layer 116*. Accordingly, similar to the embodiment described above, based at least in part on the temperatures of the first and second components 102*, 104*, thermal diode 110* may transition from the connected state shown in FIG. 4 to the thermally disconnected state shown in FIG. 5 in which a gap 200* exists between the layers 112*, 116*, thereby preventing energy transfer between the first and second components 102*, 104*. However, as the temperature differential between the components 102*. 104* varies (e.g., if excessive heat begins to build up in the second component 104*), the thermal diode 110* may be configured to bridge the gap 200* created between the layers 112*, 116*, thereby allowing energy to again be transferred between the components 102*, 104*.

In general, the biasing mechanism 150 may be disposed between one of the first component 102* and the NTC layer 112* or the second component 104* and the PTC layer 116*. The biasing mechanism 150 may be generally configured to apply a compressive force against the thermal diode 110* that biases the PTC/NTC layers 112*, 116* towards the connected state. In one embodiment, the biasing mechanism may include a spring 152 In such an embodiment, spring 152 may compress the thermal diode 110* by applying a compressive force thereto. The transition point at which thermal diode 110* transitions between the connected and disconnected states may be dependent upon the first and second temperatures and the amount of the compressive force applied by the biasing mechanism 150 against the thermal diode 110*. For example, increasing the compressive force being applied to thermal diode 110* may shift the transition point, thus increasing the required temperature differential to cause disconnection between the PTC/NTC layers 112*, 116*.

Figure 6:
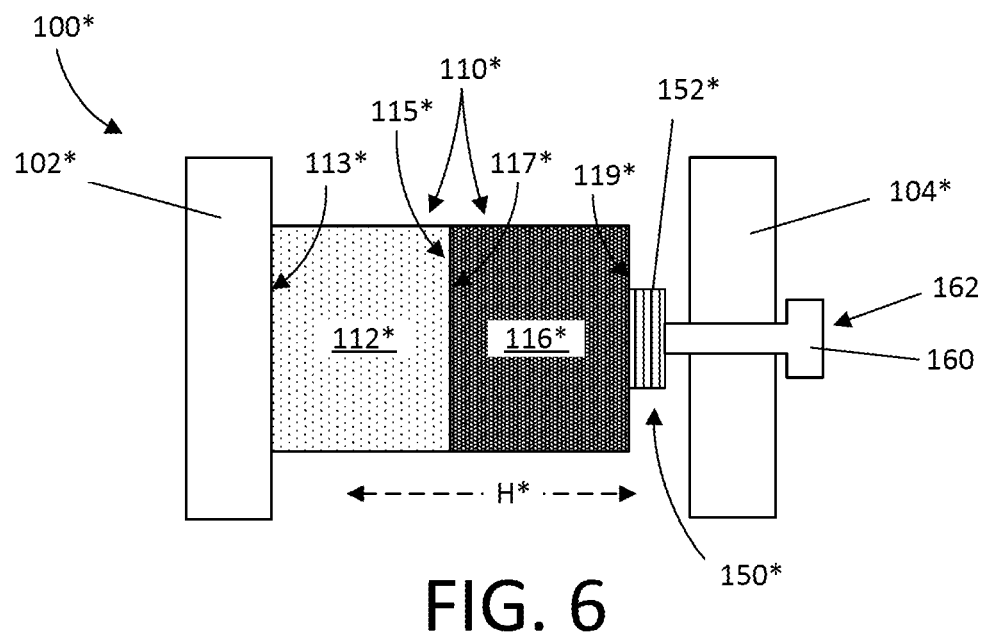
FIG. 6 illustrates a schematic side view of another embodiment of a system for controlling heat transfer between two components using a thermal diode in accordance with aspects of the present subject matter, particularly illustrating the thermal diode in a connected state.

Referring now to FIG. 6, a schematic view of an alternative embodiment of the system 100* shown in FIGS. 4 and 5 is illustrated in accordance with aspects of the present subject matter.

As shown in FIG. 6, unlike the embodiment described above in which biasing mechanism 150* is directly thermally coupled to the second component 104*, the system 100* includes an adjustment mechanism 160 coupled to biasing mechanism 150*. In general, the adjustment mechanism 160 may correspond to any suitable component that allows for the biasing force of the biasing mechanism 150* to be adjusted. For instance, in the illustrated embodiment, the adjustment mechanism is a screw 162 that extends through the second component 104* and engages an end of the biasing mechanism 150*. In such an embodiment, twisting screw 162 may selectively change the compressive force being applied by biasing mechanism 150* to thermal diode 110*. This may be advantageous for designing, or setting, thermal diode 110* for use in specific or expected environments, as changing the compressive force would require a different temperature differential between first component 102 and second component 104 to allow NTC and PTC layer 112, 116 to separate and reconnect. In other words, by adjusting the compressive or spring force applied to the thermal diode 110*, one can vary the transition point at which the thermal diode 110* transitions between the connected and disconnected states.

Figure 7:
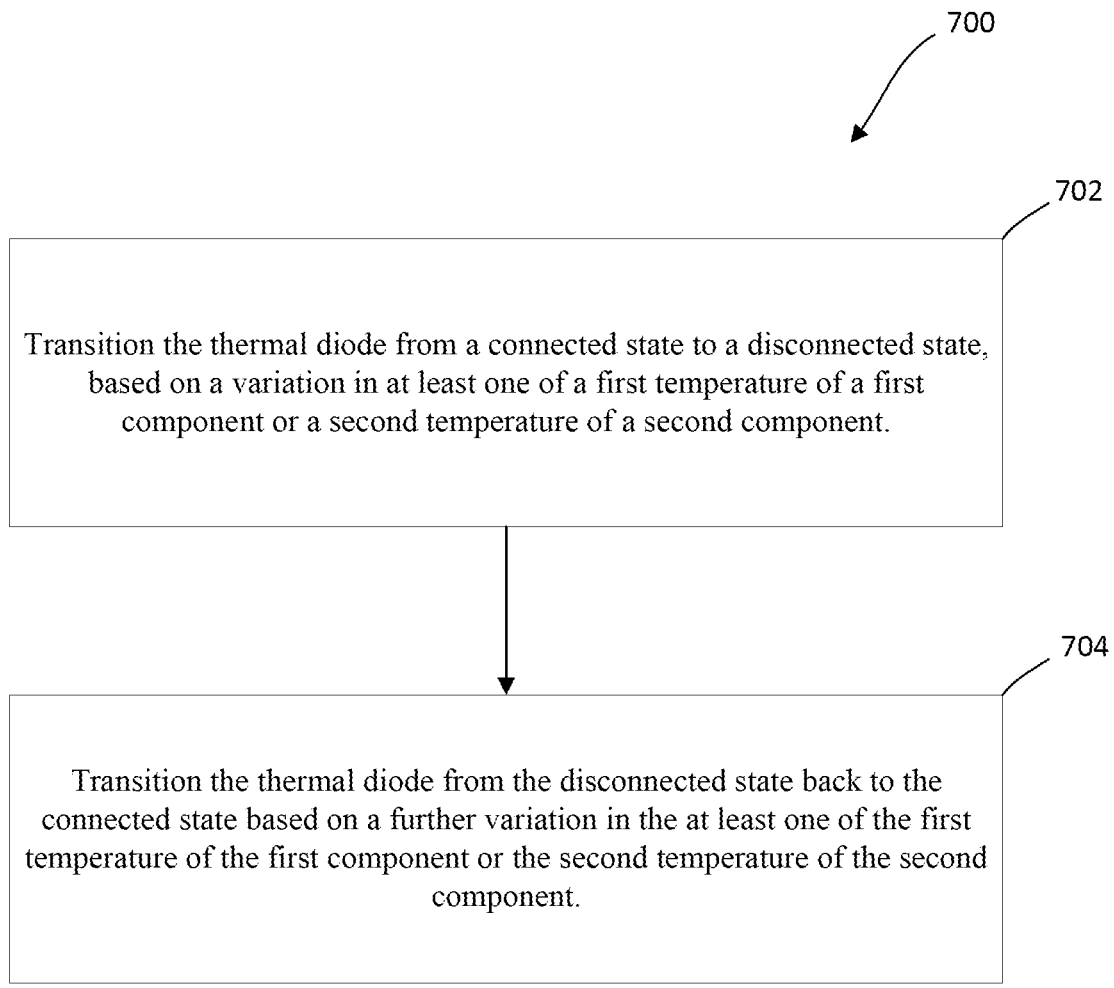
FIG. 7 illustrates a flow chart of one embodiment of a method of controlling heat transfer between components in accordance with aspects of the present subject matter.

Referring now to FIG. 7, a flow diagram of one embodiment of a method 700 of controlling heat transfer between first and second components is illustrated in accordance with aspects of the present subject matter. In general, the method 700 will be described herein with reference to the embodiments of the thermal diode 110 and 110* and related systems 100, 100* described above with reference to FIGS. 1-6. However, it should be appreciated by those of ordinary skill in the art that the disclosed method 700 may generally be utilized in association with apparatuses and systems having any other suitable configuration. In addition, although FIG. 7 depicts steps performed in a particular order for purposes of illustration and discussion, the methods discussed herein are not limited to any particular order or arrangement. One skilled in the art, using the disclosures provided herein, will appreciate that various steps of the methods disclosed herein can be omitted, rearranged, combined, and/or adapted in various ways without deviating from the scope of the present disclosure.

As shown in FIG. 7, at (702), method 700 may generally include transitioning the thermal diode from a connected state to a disconnected state. The connected state may be at which the NTC/PTC layers 112/116, 112*/116* provide the connection between the first and second components 102/104, 102*/104* to allow a flow of energy between the first and second components 102/104, 102*/104*. The disconnected state may be at which the NTC/PTC layers 112/116, 112*/116* separate from one each other to create a gap 200, 200* therebetween that prevents the flow of energy between the first and second components 102/104, 102*/104*. The transitioning of the thermal diode from the connected state to the disconnected state may be based on a variation in a first temperature of the first component 102,102* or a second temperature of the second component 104,104*.

Additionally, at (704), method 700 may generally include transitioning the thermal diode 110* from the disconnected state back to the connected state based on a further variation in the first temperature of the first component 102,102* or the second temperature of the second component 104,104*. Moreover, the transitioning of the thermal diode 110* from the disconnected state back to the connected state (and vice versa) may be further based on the material properties of the NTC/PTC layers 112/116, 112*/116* or compressive force of biasing mechanism 150.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims or if they include equivalent structural elements with insubstantial differences from the literal language of the claims.

What is claimed is:

1. A system for controlling heat transfer between components, the system comprising:
   a first component;
   a second component spaced apart from the first component;
   a thermal diode positioned between the first and second components to selectively provide a connection between the first and second components, the thermal diode comprising:
   a negative coefficient of thermal expansion layer defining an inner side and outer side, the outer side configured to be thermally connected to the first component;
   a positive coefficient of thermal expansion layer defining an inner side and an outer side, the outer side configured to be thermally connected to the second component;
   wherein the thermal diode is configured to transition between a connected state, at which the negative and positive coefficient of thermal expansion layers provide the connection between the first and second components to allow a flow of energy between the first and second components, and a disconnected state, at which the negative and positive coefficient of thermal expansion layers separate from each other to create a gap therebetween that prevents the flow of energy between the first and second components; and
   wherein the thermal diode is configured to transition back-and-forth between the connected and disconnected states with variations in at least one of a first temperature of the first component or a second temperature of the second component.

2. The system of claim 1, wherein a transition point at which the thermal diode transitions between the connected and disconnected states is dependent upon the first and second temperatures and one or more material properties of at least one of the positive coefficient of thermal expansion layer or the negative coefficient of thermal expansion layer.

3. The system of claim 2, wherein the one or more material properties comprise at least one of a thickness or coefficient of expansion/retraction of the at least one of the positive coefficient of thermal expansion or the negative coefficient of thermal expansion layer.

4. The system of claim 3, wherein the transition point occurs at different temperatures of the first and second temperatures with variations in the at least one of the thickness or coefficient of expansion/retraction.

5. The system of claim 1, further comprising a biasing mechanism disposed between one of: (1) the first component and the negative coefficient of thermal expansion layer; or (2) the second component and the positive coefficient of thermal expansion layer, wherein the biasing mechanism is configured to apply a compressive force against the thermal diode that bias the negative and positive coefficient of thermal expansion layers towards the connected state.

6. The system of claim 5, further comprising an adjustment mechanism configured to adjust an amount of the compressive force applied by the biasing mechanism against the thermal diode.

7. The system of claim 5, wherein a transition point at which the thermal diode transitions between the connected and disconnected states is dependent upon the first and second temperatures and the amount of the compressive force applied by the biasing mechanism against the thermal diode.

8. The system of claim 1, wherein, the flow of energy across the system is one of thermal energy or electrical energy.

9. The system of claim 1, wherein at least one of the first component or the second component is a heat-generating component or is coupled to a heat-generating component.

10. The system of claim 9, wherein the second component comprises an electronic component.

11. A method of controlling heat transfer between first and second components, wherein a thermal diode is positioned between the first and second components to selectively provide a connection therebetween, the thermal diode including a negative coefficient of thermal expansion layer and a positive coefficient of thermal expansion layer, the negative coefficient of thermal expansion layer defining an inner side and outer side, with the outer side of the negative coefficient of thermal expansion layer being thermally connected to the first component, the positive coefficient of thermal expansion layer defining an inner side and an outer side, with the outer side of the positive coefficient of thermal expansion layer being thermally connected to the second component; the method comprising:

transitioning the thermal diode from a connected state, at which the negative and positive coefficient of thermal expansion layers provide the connection between the first and second components to allow a flow of energy between the first and second components, to a disconnected state, at which the negative and positive coefficient of thermal expansion layers separate from each other to create a gap therebetween that prevents the flow of energy between the first and second components based on a variation in at least one of a first temperature of the first component or a second temperature of the second component; and transitioning the thermal diode from the disconnected state back to the connected state based on a further variation in the at least one of the first temperature of the first component or the second temperature of the second component.

12. The method of claim 11, wherein transitioning the thermal diode between the connected and disconnected states comprises transitioning the thermal diode between the connected and disconnected states at a transition point dependent upon the first and second temperatures and one or more material properties of at least one of the positive coefficient of thermal expansion layer or the negative coefficient of thermal expansion layer.

13. The method of claim 12, wherein the one or more material properties comprise at least one of a thickness or coefficient of expansion/retraction of the at least one of the positive coefficient of thermal expansion or the negative coefficient of thermal expansion layer.

14. The method of claim 13, wherein the transition point occurs at different temperatures of the first and second temperatures with variations in the at least one of the thickness or coefficient of expansion/retraction.

15. The method of claim 12, further comprising applying a compressive force against the thermal diode via a biasing mechanism to bias the negative and positive coefficient of thermal expansion layers towards the connected state.

16. The method of claim 15, further comprising adjusting an amount of the compressive force applied against the thermal diode by the biasing mechanism.

17. The method of claim 15, wherein a transition point at which the thermal diode transitions between the connected and disconnected states is dependent upon the first and second temperatures and an amount of the compressive force applied against the thermal diode.

18. The method of claim 11, wherein the flow of energy across the system is one of thermal energy or electrical energy.

19. The method of claim 11, wherein at least one of the first component or the second component is a heat-generating component or is coupled to a heat-generating component.

20. The method of claim 19, wherein the second component comprises an electronic component.

\* \* \* \* \*